United States Patent [19]

Kennedy et al.

[11] 4,006,268

[45] Feb. 1, 1977

[54] VAPOR COLLIMATION IN VACUUM DEPOSITION OF COATINGS

[75] Inventors: Kurt D. Kennedy, Berkeley; E. Darrell Erikson, Castro Valley; Glen R. Scheuermann, Oakland, all of Calif.

[73] Assignee: Airco, Inc., Montvale, N.J.

[22] Filed: Mar. 17, 1975

[21] Appl. No.: 558,997

[52] U.S. Cl. .............................. 427/42; 427/248 R; 427/250

[51] Int. Cl.$^2$ .................. C23C 13/02; C23C 13/04

[58] Field of Search ............ 427/42, 124, 250, 251, 427/13, 248, 38

[56] References Cited

UNITED STATES PATENTS

| 3,620,815 | 11/1971 | Blecherman et al. | 427/251 |
| 3,756,193 | 9/1973 | Carmichael et al. | 427/42 X |

*Primary Examiner*—James R. Hoffman
*Attorney, Agent, or Firm*—H. Hume Mathews; E. W. Bopp; D. A. Draegert

[57] ABSTRACT

An improved method is disclosed for coating substrates, such as turbine engine parts, at high rates by a physical vapor deposition process. The substrate to be coated and a vapor source, such as a metal alloy, heated by an electron beam, are placed in a chamber in which a gas pressure of greater than about 5 mT is maintained. When the source material is evaporated at a very high rate, such as greater than about 0.1 g/s or 13 g/s.m$^2$, the vapor is collimated and the collimation increases as the gas pressure or the evaporation rate increases. Collimation of the vapor allows a much higher deposition rate for a given evaporation power. Further, a much higher fraction of the evaporated material is deposited on the substrate. Despite the collimation, evaporated material deposits on areas of the substrate which are not in line-of-sight of the vapor source. If desired a substrate bias can be applied to bombard the substrate with ions before and during coating.

10 Claims, 2 Drawing Figures

VAPOR COLLIMATION IN VACUUM DEPOSITION OF COATINGS

BACKGROUND OF THE INVENTION

The present invention relates generally to processes for coating articles by physical vapor deposition and, more particularly to processes utilizing electron bombardment energy.

Surface coatings have become particularly important in applications where the physical and chemical properties of materials must meet stringent requirements. One such application is the use of protective coatings to increase the corrosion and erosion resistance of interior parts of gas turbine engines. A number of special alloys have been developed for use as coating materials.

Surface coatings have been applied in a variety of ways. One method useful in coating with high melting temperature materials is physical vapor deposition in which material evaporates from a molten pool in vacuum and travels to the substrate where it deposits.

If the coating process conditions are such that vapor particles encounter few other atoms or molecules, then the vapor travels outward from the source along straight lines. The directional distribution of the vapor is described by a well-known Cosine Law which is applicable when the diameter $d$ of the molten pool of the vapor source is small compared to the mean free path $\lambda$ in the vapor between the source and substrate. The result is that a coating of uniform thickness would be deposited on the interior surface of a sphere tangent to the pool and having a diameter large compared to $d$.

It is well known that deviations from the Cosine Law are observed at high evaporation rates in vapor sources which are heated by an electron beam in a high vacuum, such as 0.1 mT (millitorr) or less. In such cases, the relative deposition rate directly over the source is greater than that given by the Cosine Law. Departures from the Cosine Law have also been observed during high vacuum evaporation of material from resistance heated boats (see K. R. Carson et al, J. Vac. Sci. Tech., Vol. 7, No. 2, pp. 347–350, 1970). Similar departures from the Cosine Law have been observed in molecular beams flowing out of an orifice into high vacuum. Theories indicate that departure from the Cosine Law can be expected when the ratio $\lambda/d$ becomes less than about one.

High rate electron beam evaporation has also been done in chambers where the gas pressures were in the range up to around 30 mT. (see U.S. Pat. No. 3,756,193 to D. C. Carmichael et al.) Collisions between the vapor and the gas result in deviations from the Cosine Law in that evaporated material is deposited on areas which are not in line-of-sight of the vapor source.

In many evaporation processes, the substrate subtends only a small solid angle at the vapor source and much of the evaporant is wasted because it is deposited on the walls of the chamber. It is desirable to increase the efficiency of such a coating process by collimating the vapor so that a higher fraction is incident on the substrate. Vapor collimation is particularly important when the evaporant material is scarce or expensive. Such collimation also allows higher coating rates or lower evaporation powers and thus reduces the consumption of energy in the coating process.

One vapor collimation method was described by Blecherman et al in U.S. Pat. No. 3,620,815. There the vapor was collimated by surrounding the vapor source with a gas manifold which directed a high velocity stream of inert gas toward the substrate.

SUMMARY OF THE INVENTION

The present invention is a method of collimating the vapor from a vapor source by evaporating at a very high rate in the presence of a gas at a pressure of greater than about 5 mT.

It is essential that the evaporation be maintained at a very high rate. For example, the vapor source should have a mass evaporation rate greater than about 0.1 grams/second (g/s) or a mass flux greater than about 13 grams/(second·square meter) (g/s·m$^2$). Such an evaporation rate is significantly higher than that utilized in previous processes for which a maximum mass evaporation rate of about 0.02 g/s or a mass flux of about 2 g/s·m$^2$ was typical.

The present method does not require the introduction of gas as a high velocity stream directed from the source toward the substrate. Rather, the means of introduction of the gas is not critical as long as the general gas pressure in the chamber is maintained greater than about 5 mT. Because the scattering of an electron beam increases as the pressure increases, a gas pressure less than about 100 mT is preferred when an electron beam source is used. Use of a gas pressure in the range 20 to 40 mT is even more preferred.

One object of the present invention is to increase the fraction of evaporated material which is deposited on the substrate.

A second object is to increase the deposition rate at a given level of evaporation power.

A third object is to deposit coating material in areas of the substrate which are not in line-of-sight of the vapor source.

DESCRIPTION OF THE PREFERRED EMBODIMENTS

Figure 1:
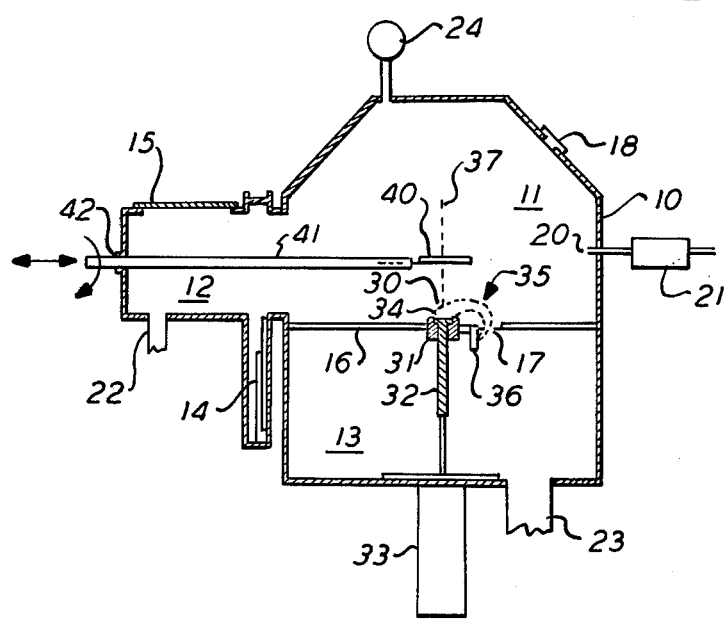
FIG. 1 is a cross-sectional view of a vacuum deposition apparatus which is suitable for performing the method of the invention.

The method of this invention can be performed with the physical vapor deposition apparatus as shown in FIG. 1. The substrate 40 to be coated and a vapor source 30 are placed in a chamber 10 which has a means, such as a gas unit 20, by which a particular gas pressure can be maintained in the chamber.

The chamber 10 may be divided into a processing chamber 11, a loading chamber 12 and a high vacuum chamber 13. The loading chamber 12 can be isolated from the processing chamber 11 by a sliding valve 14. The loading chamber can be evacuated by a suitable pumping means (not shown) connected to a first conduit 22. The high vacuum chamber 13 is separated from the processing chamber 11 by a barrier 16 which has an opening 17. The high vacuum chamber can be evacuated by a suitable pumping means (not shown) connected to a second conduit 23.

An inlet 20 is provided to that a gas can be introduced into the chamber. A conventional means, such as an ionization gauge 24, is provided to measure the pressure in the processing chamber 11 at a location out of the path of most of the evaporant vapor. The pressure can be adjusted by conventional means, such as a flow regulator 21.

The vapor source 30 may comprise a crucible 31, a rod or ingot of evaporant material 32 and a heating means, such as an electron beam source 36. A source-feed mechanism 33 is used to supply evaporant material to the crucible at a desired rate. A pool 34 of molten evaporant is formed in the crucible by irradiation with an electron beam 35 from the electron-beam source 36. A view port 18 is provided for visually monitoring the height of the pool in the crucible so that the source-feed mechanism and the electron-beam power supply (not shown) can be adjusted to keep the pool height constant. The center line of the vapor source is a line 37 which is normal to the surface of the molten pool and passes through the center of the pool.

In order to prevent formation of a glow discharge and arcing between the elements of the electron-beam source, it is preferred to mount the electron-beam source in the high vacuum chamber. The crucible 31 extends through the barrier 16 and the electron beam enters the processing chamber by passing through the opening 17. As is well-known in the art, the electron beam can be made to sweep across the surface of the molten pool to produce more uniform heating and increase the spatial uniformity of the evaporation rate from the molten area.

The substrate 40 is loaded into the chamber 12 via the entrance port 15 and secured to a support rod 41. The substrate can be moved into the processing chamber by manipulating the support rod which extends outside the chamber 10 through the sliding-rotating seal 42. If desired, a menas (not shown) can be provided to apply an electric potential between the vapor source and the substrate. Further details of the apparatus are given in an article by E. D. Erikson, one of the co-inventors, in J. Vac. Sci. Tech., Vol. 11, No. 1, pp. 366–370, 1974.

Conventionally, the first step in a physical vapor deposition process is to eliminate most residual gas by evacuating the chamber 10 to a pressure of less than about 0.5 mT. With the isolation valve 14 closed, the substrate or other articles to be coated are loaded into the loading chamber 12 which is then re-evacuated. If desired, the substrate can be sputter-cleaned and heated by admitting an ionizable gas, such as argon, and establishing a glow discharge. When the substrate is ready for coating, the isolation valve 14 is opened. The pressure in the processing chamber 11 is increased by introducing gas through the inlet 20. According to the invention, the gas pressure in the processing chamber 11 is maintained above about 5 mT.

The vapor source is activated by energizing the electron-beam source 36 and the rod feed mechanism 33. According to the invention, the mass evaporation rate is maintaind above about 0.1 g/s or the mass flux above about 13 g/s·m².

While the vapor source is operating as desired, the substrate is moved into coating position. If desired, the orientation of the substrate can be varied during the coating process to obtain a more uniform thickness distribution. When the coating is complete, the substrate is withdrawn back into the loading chamber 12. After the isolation valve 14 has been closed and the loading chamber brought to atmospheric pressure, the substrate is removed from the chamber.

EXAMPLES

The collimation effect of the present invention has been observed in a variety of experiments. In a first set of experiments, material was evaporated at a constant rate and a series of substrates were coated for a fixed time in a high vacuum of 0.01 mT and at each of six different pressures in the range 5 to 70 mT. For the experiments at 5 mT and above, a constant pressure was maintained by introducing argon into the processing chamber.

The material supplied to the crucible was a 4.9 cm (2 in.) diameter rod of 304 L stainless steel. Stainless steel was used because it is readily available and serves as an adequate model of more complicated and more expensive alloy systems. The source rod was fed into the crucible at a constant rate of 33.9 $\mu$m/s. Since each substrate was coated for 20 minutes, the same volume, 77.1 cm³, and the same mass, about 620 g, of stainless steel were evaporated during each coating run. The mass evaporation rate was 517 mg/s. Assuming an average atomic weight of 56.7 for the alloy, the particle evaporation rate was 9.11 × 10⁻³ mole/s where one mole is equal to 6.02 × 10²³ atoms.

The inside diameter of the crucible and the diameter of the molten pool were 9.53 cm (3.75 in.). The surface area of the molten pool was approximately 71 cm². The electron beam was swept along a generally triangular path on the pool surface at a frequency of 400 Hz. Ignoring the variation across the pool, the mass flux was 72.6 g/s·m² and the particle flux was 1.28 mole/s·m².

The electron beam power was approximately 54 kW (1.8A at 30 kV) during the coating runs at 0.01 mT. Again ignoring the variation across the pool, the energy flux was about 7.6 MW/m². The power had to be increased to maintain a constant pool height as the pressure increased. This is attributed to the attenuation of the electron beam at higher pressures because of increased collisions between the transit electrons and residual and/or added gas atoms. The maximum beam power was 102 kW (14 MW/m²) which was used during the runs at 70 mT.

Each substrate was a right angle bar of 304 stainless steel which was 2.5 × 2.5 × 28 cm long and 0.31 cm thick. Before coating, the substrate were sputter-cleaned and heated to a temperature in the range 815° to 1040° C. Each substrate was positioned normal to the center line of the vapor source at a separation distance of 32.4 cm. In these experiments the substrate was not moved during the coating period.

In some experiments the substrate included a flat cross piece which extended at right angles to the angle bar and the center line of the evaporation source. Measurements of the coating thickness on the cross piece and the angle bar indicated that the coating distribution was nearly symmetrical about the center line of the evaporation source and that the coating thickness distribution on the cross piece was identical in form to that of the angle bar.

Figure 2:
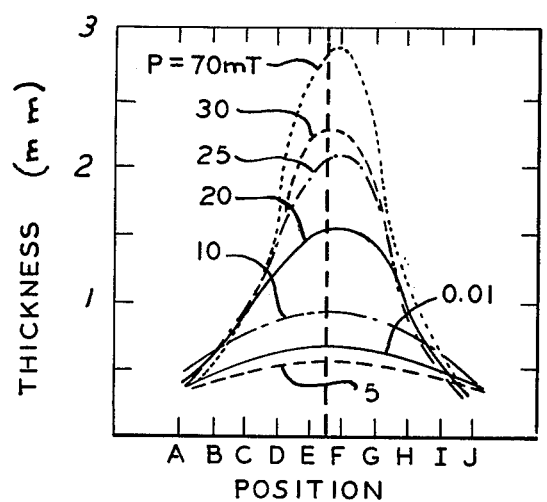
FIG. 2 is a graph of the thickness of the coating deposited at each of ten positions on a substrate at various values of gas pressure P in the chamber.

The results of the first set of experiments are shown in FIG. 2. The thickness of the deposited coating was measured at each of ten (labeled A, B...J) locations along the substrate. The distance between measurement locations was 2.5 cm (1 in.). The center line of the vapor source passed halfway between location E and F and is represented by the vertical dashed line in the center of FIG. 2. A curve representing data at each of the seven different pressures is shown. Each curve is labeled with the corresponding gas pressure P in mT.

In each case, the curves indicate that the coating thickness and, hence, the deposition rate, were greater near the center of the substrate than near the ends. This is not surprising. However, the curves for 10 mT and above clearly indicate that the deposition rate near the center line of the vapor source increased significantly as the gas pressure increased. The data indicate a threshold, about 5 mT for this evaporation rate, above which the collimation effect is observed. For unexplained reasons, the curve for 5 mT lies below the curve for 0.01 mT. This may be the result of experiment deviations. The thickness data were generally reproducible to within ± 12% in separate coating runs under similar conditions.

The evaporation rate and the total amount of material evaporated were constant for the seven curves in FIG. 2. Thus, as the gas pressure increased, a higher fraction of the evaporated material was deposited on the substrate. The increased deposition rate along the center line of the vapor source must have been accompanied by a decreased deposition rate in directions at large angles from the center line. Such an effect is indicated by the crossing of certain curves in FIG. 2, and it is expected that it would have been clearly apparent if longer substrates had been used.

The data of FIG. 2 indicate a collimation effect which is in addition to the well-known deviations from the Cosine Law observed at high vacuum. It should be noted again that the evaporation rate used here is larger by a factor of 6 than the typical "high rate" vacuum evaporation. This fact is reflected in the high vacuum deposition rate which was 550 nm/s compared to a typical "high" rate of 90 nm/s.

FIG. 2 indicates that the deposition rate near the center line of the vapor source increases with increasing gas pressure up to 70 mT which was the limit of the apparatus. Increased scattering at higher pressures places a practical upper limit of about 100 mT on an evaporation process in which an electron beam is used. Further, FIG. 2 indicates that the maximum deposition rate increases more slowly with pressure in the range above about 49 mT. On the other hand, the maximum rate increases rapidly with pressure from the threshold up to about 20 mT. Thus, the preferred operating range is between about 20 and 40 mT.

Evaporant material was deposited on the sides of the right-angle bar which were not facing the vapor source. Thus, despite the collimation, non-line-of-sight coating was obtained.

A second set of experiments was done in which substrates were coated at different pressures but with the same electron-beam power. Table I gives the beam power, mass evaporation rate, gas pressure and maximum thickness measured near the center of the substrate after it was coated for 20 minutes. Data could not be obtained when the beam power was less than 24 kW because of uncontrollable fluctuations in the area of the molten pool.

TABLE I

Results of Constant Power Experiments

| Beam Power (kW) | Mass Evaporation Rate (mg/s) | Gas Pressure (mT) | Maximum Thickness ($\mu$m) |
|---|---|---|---|
| 24 | 41 | 20 | 66 |
|  | 33 | 40 | 76 |
|  | 96 | 60 | 328 |
| 30 | 93 | 20 | 152 |
|  | 94 | 40 | 228 |
|  | 94 | 60 | 488 |

The data in Table I indicate that at a given gas pressure, the vapor collimation increases as the beam power increases. At a beam power of 30 kW, the maximum thickness of the coating increased by 50% when the pressure increased from 20 to 40 mT. However, when the beam power was 24 kW the same pressure change increased the maximum coating thickness only 15%, barely more than the experimental deviation. These data indicate a threshold, about 24 kW for 40 mT, above which the collimation effect is observed. The beam power at threshold evidently increases as the gas pressure decreases, because Table I indicates that threshold is probably 30 kW for about 20 mT, and the results of the first series of experiments indicate that the threshold is about 60 kW for 5 mT.

For the Type 304 stainless steel alloy, the gas pressure, beam power and other parameters at threshold are indicated in Table II. Because of the difficulty in obtaining data, exact values cannot be given for the parameters and the relationship between pressure and evaporation rate is only approximate. Further, it should be noted that the evaporation rate at threshold probably depends upon the composition of the particular material evaporated.

TABLE II

Threshold Parameters

| Gas Pressure (mT) | Beam Power (kW) | Mass Rate (mg/s) | Mass Flux g/s · m$^2$ | Particle Flux (mole/s · m$^2$) | Maximum Deposition Rate (nm/s) |
|---|---|---|---|---|---|
| 40 | 24 | 33 | 5 | 0.08 | 63 |
| 20 | 30 | 93 | 13 | 0.23 | 127 |
| 5 | 60 | 517 | 73 | 1.28 | 444 |

In a third series of experiments, thickness distributions virtually identical to those shown in FIG. 2 were obtained when substrates were coated under similar conditions except for the application of a negative electrical potential to the substrate during coating. The negative bias ranged from 3 to 7 kV. Such operation is known in the art as "ion plating."

In a fourth series of experiments, turbine engine parts were coated with an alloy of cobalt, chromium, aluminum and yttrium. Before coating the parts were sputter-cleaned and heated for 5 to 7 minutes in a glow discharge established in an argon pressure of 30 to 50 mT by applying an electric potential of 8 kV at 2 A. The parts were rotated and a negative bias of 8 kV was applied during coating. The parts were coated for 10 minutes at several argon gas pressures and electron-beam powers. A relative indication of the deposition rate and the extent of the collimation effect were obtained from the mass gained by the part during coating. The results, given in Table III indicate that the deposition rate increased as the gas pressure increased for a given power level. Further, at a given gas pressure, the collimation increased as the beam power or evaporation rate increased.

TABLE III

| Beam Power (kW) | Mass Evaporation Rate (g/s) | Mass Gain at Given Gas Pressure | | |
|---|---|---|---|---|
| | | Gas Pressure | | |
| | | 20 mT | 40 mT | 60 mT |
| 30 | 21 ± 1 | 24g | 42g | 46g |
| 45 | 29 ± 1 | 28 | 60 | 72 |
| 60 | 37 ± 5 | 42 | 58 | * |

* Apparatus unable to obtain a pressure of 60 mT at 60 kW.

A detailed explanation of the origin of the collimating effect has not been developed. It should be noted that the evaporation rate in these experiments was so high that the mean free path in the region between the vapor source and the substrate is probably much less than the diameter $d$ of the source even at the lowest pressure 0.01 mT. Thus the collimation effect cannot be explained as the result of the ratio $\lambda/d$ being reduced from much larger than one to less than one as the gas pressure increases from 0.01 to 70 mT.

It is believed that the vapor collimation of the present invention is the result of interactions between the vapor and gas particles in which the mass flux or paticle flux of the vapor and the pressure of the gas are important parameters. The values of these parameters at the observed thresholds are given in Table II.

The size, either the area or diameter, of the molten pool may also be an important parameter. Practically, with a single electron gun, high coating rates of substrates sizes typical of turbine engine parts can be obtained with molten pool areas in the range 0.001 m² to 0.050 m², and these areas are preferred. The molten pool need not be circular. Further, use of more than one electron beam or some other heating method could allow the use of larger vapor sources.

The collimation effect has been observed with gases other than argon. Experiments with hydrogen and mixtures of hydrogen and argon indicated that at a given pressure the collimation inreased slightly as the average atomic weight of the gas increased. Use of an inert gas is preferred in normal coating situations, but as known in the art, coatings are sometimes made by evaporating in the presence of a reactive gas, such as oxygen.

What is claimed is:

1. A method of coating a substrate by physical vapor deposition comprising:
   placing a substrate and a vapor source having an area greater than 0.001 m² in a chamber;
   providing a particle flux of the vapor source greater than 0.25 mole/s·m²;
   collimating the vapor by providing a gas in the chamber at a pressure greater than 5 mT and less than 100 mT; and
   positioning the substrate to intercept a portion of the collimated vapor which is directed outward from the vapor source.

2. A method according to claim 1 in which the particle evaporation rate is maintained above 0.002 mole/s.

3. A method according to claim 2 in which the gas pressure is maintained by introducing an inert gas.

4. In a coating method wherein material is evaporated inside an evacuable chamber by an electron beam incident on a molten pool having an area greater than 0.001 m² and is deposited on a substrate, the improvement comprising:
   providing a mass evaporation flux of the molten pool above 13 g/s·m²;
   collimating the vapor by providing a gas in the chamber at a pressure greater than 5 mT and less than 100 mT; and
   positioning the substrate to intercept a portion of the collimated vapor which is directed outward from the molten pool.

5. A method according to claim 4 wherein the area of the molten pool is less than 0.05 m² and the mass evaporation rate is greater than 0.1 g/s.

6. A method according to claim 5 wherein the gas pressure is greater than 20 mT and less than 40 mT and is maintained by introducing an inert gas.

7. A method according to claim 6 wherein the substrate is a metal alloy and the material in the molten pool is a metal alloy.

8. A method according to claim 7 wherein the inert gas is argon.

9. In a coating method wherein an alloy is evaporated inside an evacuable chamber by an electron beam incident on a molten pool having an area greater than 0.001 m² and is deposited on a turbine engine part, the improvement comprising:
   providing an inert gas in the chamber at a pressure greater than 5 mT and less than 100 mT;
   increasing the electron beam power to a level greater than 24 kW and greater than a threshold value marked by a significant increase in the deposition rate along the direction normal to the molten pool; and
   positioning the turbine engine part to intercept a portion of the vapor directed outward from the source.

10. In a coating method wherein an alloy is evaporated inside an evacuable chamber by an electron beam incident on a molten pool having an area greater than 0.001 m² and is deposited on a turbine engine part, the improvement comprising:
    providing an inert gas in the chamber at a pressure greater than 5 mT and less than 100 mT;
    increasing the electron beam power until the deposition rate at a distance of at least 0.3 m outward along the center line of the molten pool exceeds 60 nm/s, and until the power exceeds a threshold value marked by a significant increase in said deposition rate; and
    positioning the turbine engine part to intercept a portion of the vapor directed outward from the source.

* * * * *